United States Patent [19]
Freer et al.

[11] Patent Number: 5,576,935
[45] Date of Patent: Nov. 19, 1996

[54] COMMON CIRCUIT BOARD CONNECTABLE TO MULTIPLE ALTERNATIVE SINGLE-SIDED EXPANSION BOARDS

[75] Inventors: Raymond A. Freer; Michael L. Marshall, both of Houston; Ronald D. Noblett, Bellaire; Joseph R. Allen, Tomball, all of Tex.

[73] Assignee: Compaq Computer Corporation, Houston, Tex.

[21] Appl. No.: 410,115

[22] Filed: Mar. 24, 1995

[51] Int. Cl.⁶ .............................. H01R 23/70; H01R 9/09; H05K 1/11; H05K 7/14
[52] U.S. Cl. .............................. 361/785; 211/41; 307/71; 361/728; 361/729; 361/731; 361/784; 361/788; 361/803; 361/796; 439/61; 439/65; 439/62; 439/64; 439/374; 439/377
[58] Field of Search .............................. 211/41; 307/71; 307/85, 150, 151; 361/728, 729, 730, 731, 733, 736, 741, 752, 756, 784, 785, 786, 788, 791, 796, 797, 801, 802, 803; 364/708.1; 439/61, 62, 64, 65, 79, 374, 377

[56] References Cited

U.S. PATENT DOCUMENTS

| | | | |
|---|---|---|---|
| 4,683,550 | 7/1987 | Jindrick et al. | 361/785 |
| 4,885,482 | 12/1989 | Sharp et al. | 307/465 |
| 5,162,675 | 11/1992 | Olsen et al. | 361/786 |
| 5,163,833 | 11/1992 | Olsen et al. | 439/61 |
| 5,181,679 | 1/1993 | Frielinghaus et al. | 439/65 |

FOREIGN PATENT DOCUMENTS

| | | | |
|---|---|---|---|
| 2243247 | 10/1991 | United Kingdom | 439/65 |

OTHER PUBLICATIONS

*IBM Technical Disclosure Bulletin*, vol. 29, No. 10, Mar. 1987, pp. 4579–4580, ; New York, US; "Selectable bus byte order circuit" (whole document).

*Le Nouvel Automatisme*, vol. 29, No. 45, Apr. 1984, pp. 42–44, Paris, FR; "Bitbus: du bus au réseau" (Figure 1).

*Electronics International*, vol. 56, No. 23, Nov. 1983, p. 194, New York, US; "Industrial IBM–PC–to–STD link is isolated" (Figure).

*Primary Examiner*—Donald A. Sparks
*Attorney, Agent, or Firm*—Pravel, Hewitt, Kimball & Krieger

[57] ABSTRACT

A expansion board including a main board, a common board and a system connector. The main board including a cutout and a board connector for receiving the common board. The common board having a data connector at one end and a board connector at the other end. The board connector being mounted perpendicular to the system connector to connectably mate to the common board whether components are mounted on either side of the main board. The main board includes circuitry for one of several expansion buses, the common board contains circuitry independent to any specific expansion bus.

7 Claims, 3 Drawing Sheets

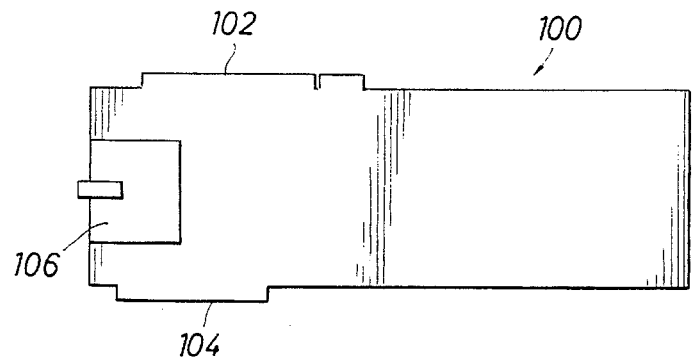
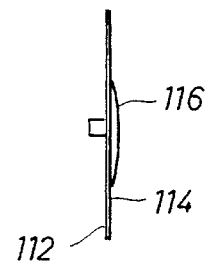
FIG. 1A
(PRIOR ART)
FIG. 1B
(PRIOR ART)
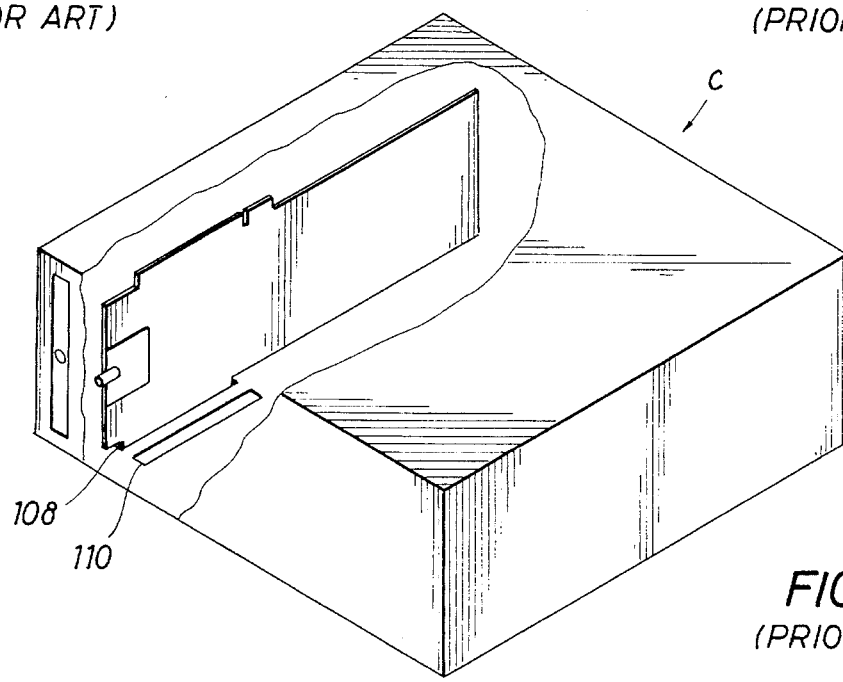
FIG. 1C
(PRIOR ART)
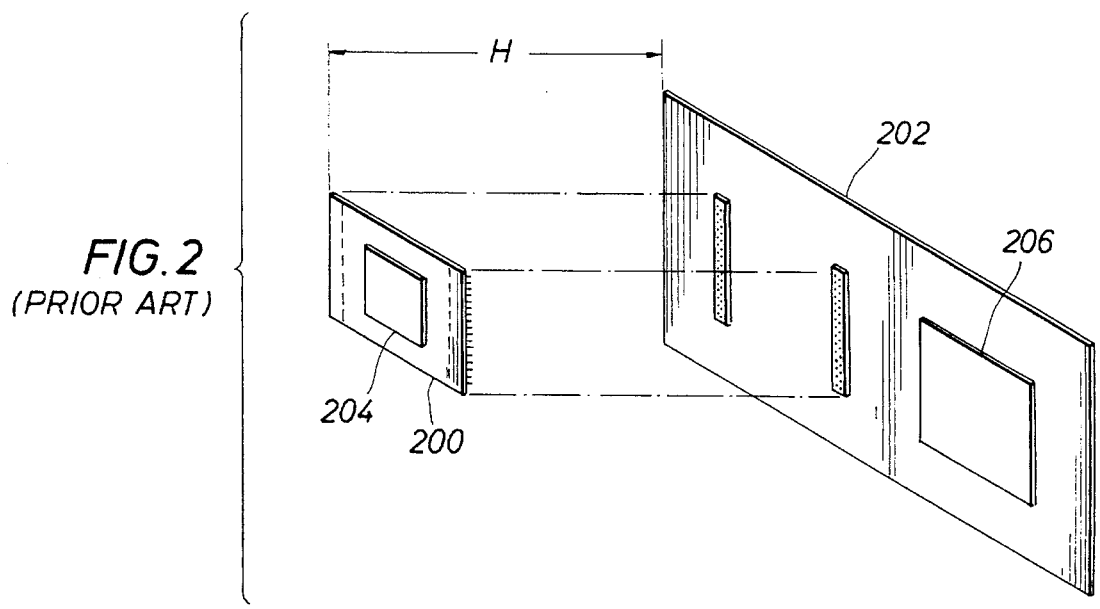
FIG. 2
(PRIOR ART)

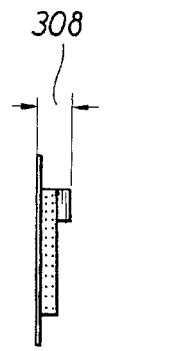
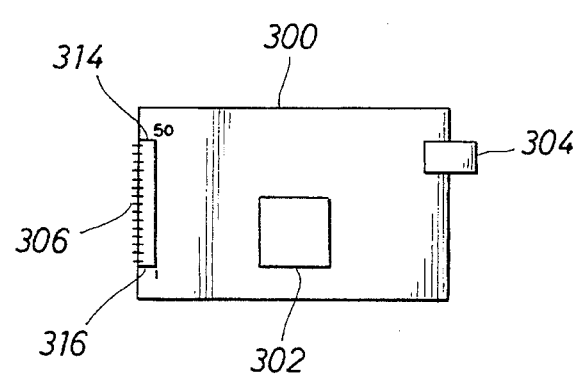
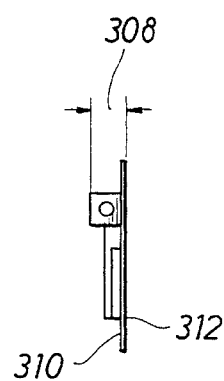
FIG.3A        FIG.3B        FIG.3C
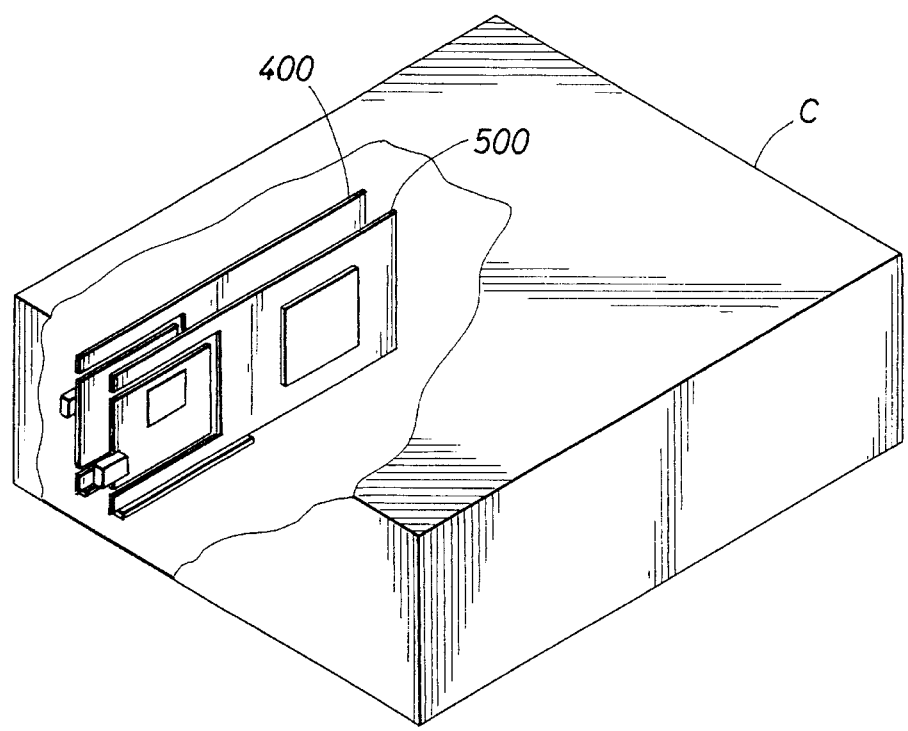
FIG.6

COMMON CIRCUIT BOARD CONNECTABLE TO MULTIPLE ALTERNATIVE SINGLE-SIDED EXPANSION BOARDS

BACKGROUND OF THE INVENTION

1. Field of the Invention

The invention relates to modular expansion boards for leveraging a single circuit across multiple expansion boards and more particularly to expansion boards of alternate orientations.

2. Background of the Invention

Since the first personal computer (PC) appeared on the market, the ability of the PC to expand its functionality has been a significant factor to its success. From the beginning, each PC included an expansion bus for adding functionality. Many familiar functions, such as graphics, network communications and telecommunications have typically been found on expansion boards. This allows the computer user to purchase a relatively low priced computer and later upgrade the system with certain functionality available on an expansion board.

For many years, the primary expansion bus has been the ISA bus (for Industry Standard Architecture). The ISA bus has a 24-bit address bus and an 8 or 16 bit data bus and operates at a maximum frequency of 8.33 MHz. The system board of the PC includes connectors, or slots, for receiving up to eight ISA expansion boards. An ISA expansion board has a edge connector on its bottom edge for connecting to the system board connector. The system board connectors are oriented so that the ISA expansion board extends up perpendicularly from the system board when mounted, with one edge being adjacent the rear of the PC. An opening at the rear of the PC adjacent each expansion board allows cables to be attached to the ISA expansion board. Each system board connector is mounted adjacent another and each ISA expansion board is allotted a certain width which restricts components except for simple surface mount resistors and capacitors, to one side of the expansion board. Thus, this arrangement permits a series of ISA expansion boards to be connected in a small amount of space.

As PCs became more networked and reliant on file servers, the ISA bus became a bottleneck. Additionally, as 32-bit processors became the mainstream processor, the 16-bit ISA bus was deemed inadequate. Thus, an improvement to the ISA bus, known as the microchannel architecture bus (MCA), was developed by International Business Machines (IBM). The MCA bus provides full 32-bit data, and an improved data transfer mechanism. However, the MCA bus diverged significantly from the ISA bus, and therefore does not maintain backwards compatibility with the ISA bus. The MCA bus utilizes a different connector from that of the ISA bus.

A short time after the MCA bus was developed, another improved ISA bus was developed to compete with the MCA bus, known as the EISA bus (for Extended ISA). The EISA bus provides backwards compatibility with the ISA bus and extends the 16-bit data bus to 32-bits, the 24-bit address bus to 32-bits, and improves on the Direct Memory Access transfers (DMA). Physical compatibility is maintained by placing the additional EISA pins between the predefined ISA pins. Thus, an ISA expansion board can be inserted into an EISA board slot.

As expansion board manufacturers now had to support as many as three different expansion buses, they sought ways to manufacture a single board for more than one bus. One known attempt at this was performed with expansion boards designed to communicate with IBM mainframes, as described in U.S. patent application Ser. No. 5,163,833, entitled "Dual Personal Computer Architecture Peripheral Adapter Board". These dual bus expansion boards, contain a single circuit for communication with mainframe computers. The expansion board contains an MCA connector along one edge, an ISA connector along the opposite edge and a connector for receiving a removable board. The removable board is placed into the expansion board in one of two positions, depending on the type of expansion bus utilized. The components are mounted on a side consistent with MCA expansion board requirements, however, when the dual bus board is flipped over for use as an ISA board, the components are inconsistent with ISA expansion board requirements. It is also worth noting that in the dual bus boards, since only one expansion bus connector is utilized at a time, one connector is always left exposed. Thus, the possibility for electrical shorting and accelerated corrosion exists for the exposed contacts. A illustration of the general shape of a dual bus board is shown in prior art FIG. 1A. FIG. 1C illustrates the dual bus board in a computer having one of the bus architectures.

A known method exists for utilizing one circuit board with multiple other circuit boards. In this method, a daughterboard is mounted to a main board. In one case, the daughterboard contains a common circuit for connecting to multiple different main boards. In another case, the daughterboard contains different circuits for connecting to one or multiple main boards having a common daughterboard interface. Daughterboards are typically smaller circuit boards for mounting directly onto another larger main circuit board. The daughterboard typically has a pair of headers on a side opposite its component side, with one header mounted at each end of the daughterboard. The main board has a pair of female-ended connectors for receiving the daughterboard. When connected, the bottom surface of the daughterboard lies very close to the top surface of the main board, but not in the same plane. This allows a single main board to carry different variations of daughterboards, or a single daughterboard to connect to different variations of main boards. This type of arrangement is known to exist on expansion boards and system boards. However, a daughterboard for an expansion board has limited use since the width of the expansion board is limited. Thus, the height of components for a daughterboard is reduced by the distance from the surface of the main board to the surface of the daughterboard. So many components cannot be utilized with this arrangement.

As PCs became more graphically oriented, it became desirable to place some of functionality typically found on the expansion buses directly on the processor bus to achieve maximum performance. Since the processor provides limited buffer drive capability, this method has many limitations. This eventually led to another bus proposal known as the Peripheral Component Interconnect (PCI) bus. The PCI bus provides a level of performance and user convenience not available from the previous buses. Backwards compatibility was not an objective, thus another bus interface was developed. Expansion boards for the PCI bus are similar in size to ISA and EISA expansion boards. However, the connector is different from previous bus connectors and component placement is on the opposite side from the ISA/EISA expansion boards.

This again presented a problem for manufacturers that desired to create an expansion board for the PCI bus and at least one other. The methodology utilized with the prior dual bus boards was not satisfactory because the dual bus boards actually exceeded the slot spacing requirements and were more costly since they have an unused connector. The daughterboard/mainboard configuration had height limitations. Therefore a solution is necessary which allows the flexibility of daughterboards, but without the inherent height limitation, and usable where components appear on differing sides of the circuit boards for different buses.

SUMMARY OF THE INVENTION

According to the present invention, an expansion board for connecting to an expansion bus of a computer system includes a main board and a common board. The main board portion includes a cutout slightly larger than the common board, an edge connector, a board connector and circuitry for interfacing the common board to the expansion bus. The expansion bus may be any of the EISA, ISA, MCA or PCI buses. The common board contains circuitry independent of each bus. The main boards contain circuitry for interfacing one type of expansion bus to the common board. Thus, a single common board attaches to multiple main boards and interfaces to multiple expansion buses.

The common board has a board connector on its component side. The main board also has a board connector on its component side for connecting to the common board according to the common board pinout. When attached, the common board is coplanar with the main board and their component sides are adjacent each other. Together they form an expansion board.

On a PCI or MCA expansion board, the components are mounted on an opposite side from the side on which components are mounted on an ISA/EISA expansion board. Therefore, since the pinout for the common board remains unchanged, to receive the common board the board connector for the PCI and MCA expansion boards is reversed from that of the ISA and EISA expansion boards. Also in PCI and MCA expansion boards, since components are mounted on opposite sides, the common board is flipped about as compared to the ISA and EISA expansion boards.

Thus, the coplanar mounting resolves the space concerns of a daughterboard configuration, while reversing the board connector allows use in main boards intended to be used with buses having the components mounted on differing sides.

BRIEF DESCRIPTION OF THE DRAWINGS

A better understanding of the present invention can be obtained when the following detailed description of the preferred embodiment is considered in conjunction with the following drawings, in which:

FIGS. 1A, 1B and 1C illustrate a component side view of a prior art dual bus board (FIG. 1A); an end view of the dual bus board (FIG. 1B) and an isometric view of the dual bus board installed in a computer system (FIG. 1C);

FIG. 2 is an exploded view of a prior art mainboard/daughterboard combination circuit board;

FIGS. 3A, 3B and 3C illustrate three views of a common circuit board according to the preferred embodiment where FIG. 3A is an end view showing a board connector, FIG. 3B is component side view of the common circuit board, and FIG. 3C is an alternate end view showing a cable connector;

FIG. 6 is an isometric view of a computer system having both EISA and PCI slots and both a PCI and EISA expansion board installed in their respective slots.

DETAILED DESCRIPTION OF PREFERRED EMBODIMENT

Figure 4:
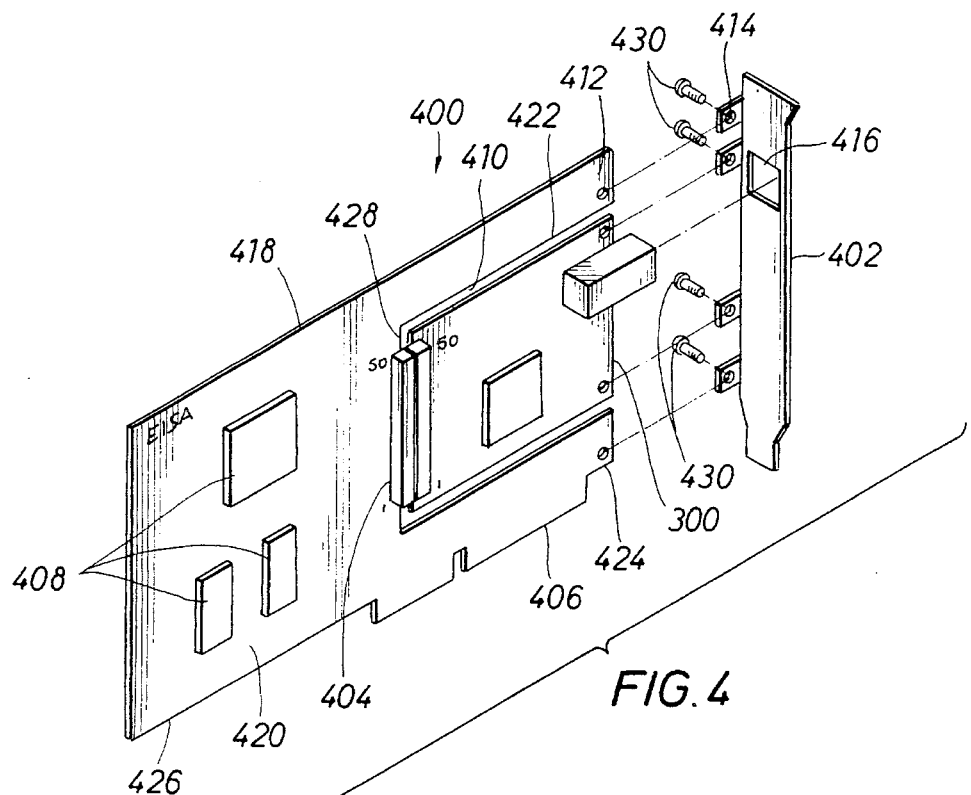
FIG. 4 is an isometric view of an EISA expansion board, the common circuit board being shown attached and an end plate being shown removed.

Reference will now be made in detail to a preferred embodiment of the invention, an example of which is illustrated in the accompanying drawings. However, prior to discussing the preferred embodiment, it is appropriate to briefly review the prior art.

FIGS. 1A and 1B illustrate a dual bus expansion board. This design allow a single expansion board to connect to two different types of expansion buses. The expansion board 100 has a component side 112 for mounting electronic and mechanical components and a back side 114. Two different edge connectors allow the expansion board 100 to connect to an ISA bus (for Industry Standard Architecture) and a MCA bus (for Microchannel Architecture). On one end and along the edge is an ISA edge connector 104 and on the same end and opposing edge is an MCA edge connector 102.

A common board 106 is removable for placing the common board 106 into the expansion board in alternate positions depending on the type of expansion bus utilized. A mounting bracket 116 receives the common board, but causes the width of the expansion board to exceed conventional limits on its back side 114 since expansion boards are substantially single sided.

Referring now to FIG. 1C, the expansion board 100 is shown installed in a computer system C in a slot 108. In this example, the computer system C has an ISA bus. For explanatory purposes, assume the computer system C includes an MCA bus and a slot 108 for receiving an MCA expansion board. In this case, expansion board 100 is utilized via its MCA bus interface when the MCA edge connector 102 is connected to the MCA slot 108. If a second expansion board where installed in a second slot 110 adjacent to the dual bus board, because of the mounting bracket 116, the second expansion board would be susceptible to being undesirably shorted out by expansion board 100 or the two boards pressed against each other. Thus the dual bus board 100 does not conform to the spacing standards of the ISA bus.

FIG. 2 illustrates a second method of connecting a common circuit board to several main boards. A daughterboard 200 contains a circuit 204 common to more than one main board 202. For example, the daughterboard could contain certain network communications circuitry independent of bus type. This allows one common board to be used on three different expansion boards—a different main board for each type of expansion bus. Each main board 202 has interface circuitry 206 specific to each type of expansion bus for interfacing the circuit 204 to the expansion bus.

As a computer has limited space for each expansion board, the height of components on the daughterboard is further limited by the distance H between the mainboard and the daughterboard. Thus, only shallow components can be mounted onto the daughterboard.

FIGS. 3A, 3B and 3C illustrate a common circuit board according to the preferred embodiment. The common circuit board 300 has a back side 312 and a component side 310 for receiving components, as shown in FIG. 3C. The component side 310 has a circuit 302, coaxial connector 304 and header 306 mounted thereon, as shown in FIG. 3B. In the preferred embodiment, the circuit 302 provides data conditioning logic for transferring network communications data between the header 306 and the coaxial connector 304.

The header 306 has right-angled pins extending from the face of the component side 310 and parallel to the component side for connecting to another circuit board. A pin 1 is at a lower end 316 and a pin 50 is at an upper end 314.

End views 3A and 3C also show distance 308 from the back side 312 of the circuit board 300 to an edge of the widest component—in this case, coaxial connector 304. It is understood that the components shown here are merely exemplary and that a wide variety of components can be used on the common circuit board 300.

Figure 5:
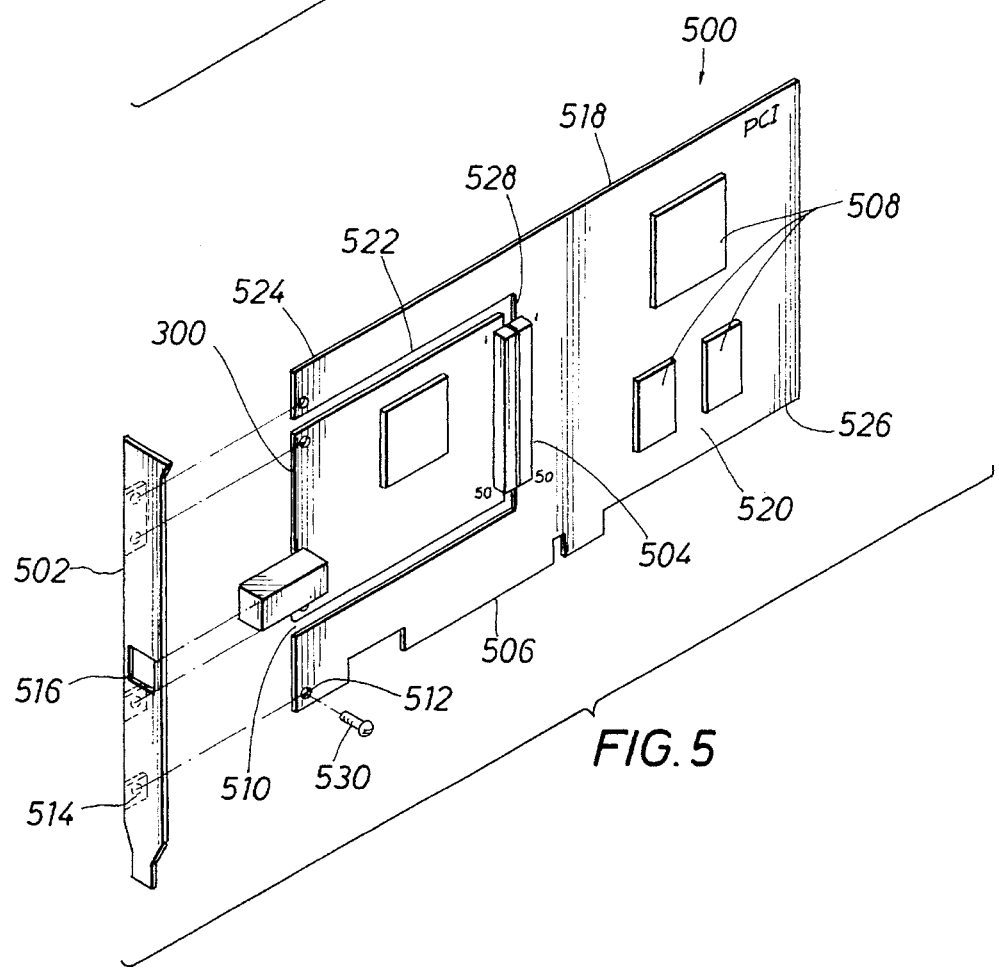
FIG. 5 is an isometric view of a PCI expansion board, the common circuit board being shown attached and an end plate being shown removed.

Referring now to FIGS. 4 and 5, two expansion boards are shown containing the common circuit board 300. FIG. 4 shows a EISA expansion board 400 including an EISA main board 418 and the common circuit board 300. At a connector end 424, the EISA main board 418 has a EISA edge connector 406, and at an opposite end 426 has EISA bus interface circuitry 408 for communicating with the EISA bus of a computer system. Also at the connector end 424, is a cutout 422 slightly larger than the common circuit board 300. A boundary edge 428 of the cutout 422 is perpendicular to the EISA edge connector 406 and has a female connector 404, mounted adjacent to the boundary edge 428. The female connector 404 is right-angled from the EISA main board 418 and mates to the header 306 of the common circuit board 300 for receiving the common circuit board 300 in the same plane as the EISA main board 418. An electrical socket for pin 1 of the common circuit board 300 is located on an end of the female connector nearest the EISA edge connector 406, and an electrical socket for pin 50 is located on the other end.

The common circuit board 300 is connectably received into the cutout 422 by connecting header 306 to female connector 404. As both connectors are mounted on the component side, the coplanar common circuit board 300 and EISA main board 418 have adjacent component sides and, thus, provide maximum component width. It should also be noted that even though resistors and capacitors can be found on the non-component side, these components are very small surface mount devices and do not interfere with space requirements of the computer. ISA and MCA expansion boards also have their components mounted on the same side as the EISA expansion board and have similar width restrictions.

For viewing, an end plate 402 is shown detached from the EISA expansion board 400, but in its final assembly the end plate 402 is attached to the EISA expansion board 400 for securing the expansion board into a computer system. Additionally, the end plate 402 keeps the common circuit board 300 securely connected to the EISA expansion board 400. Mounting holes 412 on the EISA main board 418 align with holes 414 on the end plate 402 for attaching the end plate 402 to both the EISA main board 418 and the common circuit board 300 by the use of screws 430. In the preferred embodiment, the end plate 402 has a cutout 416 of sufficient size to accommodate the coaxial connector 304, but many other variations are possible.

FIG. 5 shows a PCI expansion board 500 including an PCI main board 518 and the common circuit board 300. A comparison of FIGS. 4 and 5 will reveal that the PCI expansion board 500 has components mounted on the opposite side as compared to the EISA expansion board 400. At a connector end 524, the PCI main board 518 has a PCI edge connector 506, and at an opposite end 526 has PCI bus interface circuitry 508 for communicating with the PCI bus of a computer system. Also at the connector end 524, is a cutout 522 slightly larger than the common circuit board 300. A boundary edge 528 of the cutout 522 is perpendicular to the PCI edge connector 506 and has a female connector 504, mounted adjacent to the boundary edge 528. The female connector 504 is right-angled from the PCI main board 518 and mated to the header 306 of the common circuit board 300 for receiving the common circuit board 300 in the same plane as the PCI main board 518. An electrical socket for pin 50 of the common circuit board 300 is located on an end of the female connector nearest the PCI edge connector 506, and an electrical socket for pin 1 is located on the other end.

The common circuit board 300 is connectably received into the cutout 522 by flipping the common circuit board 300, relative to its position in the EISA expansion board 400, and connecting header 306 to female connector 504. As both connectors are mounted on the component side, the coplanar common circuit board 300 and PCI main board 518 have adjacent component sides and, thus, provide maximum component width.

Again for viewing, an end plate 502 is shown detached from the PCI expansion board 500, but in its final assembly the end plate 502 is attached to the PCI expansion board 500 for securing the expansion board into a computer system. Additionally, the end plate 502 keeps the common circuit board 300 securely connected to the PCI expansion board 500. Mounting holes 512 on the PCI main board 518 align with holes 514 on the end plate 502 for attaching the end plate 502 to both the PCI main board 518 and the common circuit board 300 using screws 530.

FIG. 6 illustrates the PCI expansion board 500 and the EISA expansion board 400 mounted in a computer system C. Thus, as illustrated in FIG. 6, while the components are mounted on opposing sides of the expansion boards, the common circuit board 300 provides a single common circuit that cooperates with either type of expansion board, while not limiting available space and reducing overall cost.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

We claim:

1. A family of expansion boards for inclusion in computer systems and for connecting to a plurality of expansion buses, the family of expansion boards comprising:

a common printed circuit board (PCB) having a component side for receiving components, and a back side opposing said component side, and mounted thereon only one PCB to PCB connector, said PCB to PCB connector being mounted on said component side and said common PCB having components substantially only on said component side;

a first expansion board including:

a main PCB having a component side for receiving components, a back side opposing said component side, an edge for connection to a first of the plurality of expansion buses and a cutout area substantially the shape of said common PCB;

only one PCB to PCB connector adapted to mate with said PCB to PCB connector of said common PCB, said PCB to PCB connector of said first expansion board being mounted on said component side of said first expansion board main PCB; and means located at said edge of said first expansion board main PCB for connecting said first expansion board main PCB to said first expansion bus; and a second expansion board including:

a main PCB having a component side for receiving components, a back side opposing said component side, a cutout area substantially the shape of said common PCB and an edge for connection to a second of the plurality of expansion buses, said second expansion main PCB component side being on the opposite face of said second expansion board main PCB with respect to said second expansion board main PCB edge as compared to said component side of said first expansion board main PCB with respect to said first expansion board main PCB edge;

only one PCB to PCB connector adapted to mate with said PCB to PCB connector of said common PCB, said PCB to PCB connector of said second expansion board being mounted on said component side of said second expansion board main PCB; and means located at said edge of said second expansion board main PCB for connecting said second expansion board main PCB to said second expansion bus.

2. The family of expansion boards of claim 1, wherein each of said common PCB, said first expansion main PCB and said second expansion board main PCB have an external end and have a mounting element located near said external end, and wherein said first expansion board and said second expansion board each further include:

an end plate adapted to mate with said mounting element of said common PCB and said main PCB.

3. The family of expansion boards of claim 2, wherein said mounting element is a hole and wherein said end plate includes threaded holes aligned with said mounting element holes and screws for mating with said threaded holes.

4. The family of expansion boards of claim 1, wherein said first and second expansion board means for connecting to said expansion bus is a card edge.

5. The family of expansion boards of claim 1, wherein said first expansion bus is an EISA bus and wherein said first expansion board further includes EISA interface circuitry mounted on said component side.

6. The family of expansion boards of claim 5, wherein said second expansion bus is a PCI bus and wherein said second expansion board further includes PCI interface circuitry mounted on said component side.

7. The family of expansion boards of claim 1, wherein said first expansion bus is a PCI bus and wherein said first expansion board further includes PCI interface circuitry mounted on said component side.

* * * * *